United States Patent [19]

Sato

[11] Patent Number: 5,320,907
[45] Date of Patent: Jun. 14, 1994

[54] CRYSTAL ARTICLE AND METHOD FOR FORMING SAME

[75] Inventor: Nobuhiko Sato, Atsugi, Japan

[73] Assignee: Canon Kabushiki Kaisha, Tokyo, Japan

[21] Appl. No.: 704,731

[22] Filed: May 20, 1991

Related U.S. Application Data

[63] Continuation of Ser. No. 415,956, Oct. 2, 1989, abandoned.

[30] Foreign Application Priority Data

Oct. 2, 1988 [JP] Japan .................. 63-247820
Sep. 29, 1989 [JP] Japan .................. 1-255523

[51] Int. Cl.⁵ ............................................ C30B 19/00
[52] U.S. Cl. ............................ 428/446; 428/698; 428/699; 428/701; 428/702
[58] Field of Search ............ 428/446, 698, 701, 699; 437/89, 90

[56] References Cited

U.S. PATENT DOCUMENTS

| Re. 33,096 | 10/1989 | Iwamatsu | 428/446 |
| 3,617,822 | 11/1971 | Kobayashi | 437/90 |
| 4,412,868 | 11/1983 | Brown et al. | 437/89 |
| 4,557,794 | 12/1985 | McGinn et al. | 156/612 |
| 4,637,127 | 1/1987 | Kurogi et al. | 437/89 |
| 4,758,531 | 7/1988 | Beyer et al. | 437/90 |

FOREIGN PATENT DOCUMENTS

0284433 9/1988 European Pat. Off. .

Primary Examiner—A. A. Turner
Attorney, Agent, or Firm—Fitzpatrick, Cella, Harper & Scinto

[57] ABSTRACT

A crystal article comprises a substrate, a plurality of single crystals provided on said substrate with adjacent single crystals contacting each other and a void generation preventive body filling the portion surrounded by said plurality of single crystals.

8 Claims, 4 Drawing Sheets

CRYSTAL ARTICLE AND METHOD FOR FORMING SAME

This application is a continuation-in-part continuation of application Ser. No. 07/415,956 filed Oct. 2, 1989, now abandoned.

BACKGROUND OF THE INVENTION

1. Field of the Invention

This invention relates to a crystal article and a method for forming the same, particularly to a crystal article having a plurality of single crystals formed on a deposition surface with their positions being controlled, and also with their positions of the grain boundaries formed at the portions where the single crystals mutually contact each other and the sizes of the single crystals being controlled and a method for forming the same.

The present invention is applicable to single crystals to be utilized for production of, for example, electronic elements such as semiconductor integrated circuits, magnetic circuits, etc., optical elements, magnetic elements, piezoelectric elements, or surface acoustic elements, etc.

2. Related Background Art

Figure 1A:
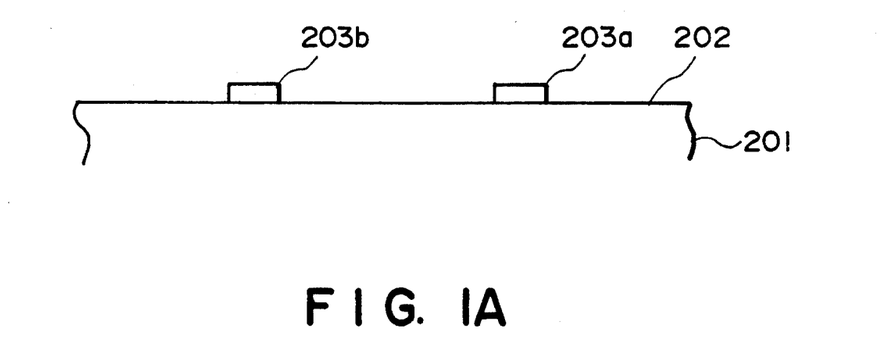
FIGS. 1A to 1C are schematic illustrations for explaining the steps of the method for forming crystal articles according to the prior art, respectively.

In the field of SOI technique which grows a plurality of single crystals on an insulating substrate, there has been proposed, for example, the method based on selective nucleation depending on the difference in nucleation density between the surface materials (T. Yonehara et al (1987), Extended Abstracts of the 19th SSDM. 191). The crystal formation method is to be described by referring to FIGS. 1A to 1C. First, as shown in FIG. 1A, on a substrate 201 having a surface 202 with small nucleation density are arranged regions 203a, 203b having surfaces with sufficiently larger nucleation density than the surface 202 with a diameter of a and an interval b. If a predetermined crystal formation treatment is applied on the substrate crystal nuclei of the deposited product will be generated only on the surfaces of the regions 203a, 203b, and never on the surface 202. Accordingly, the surfaces of the regions 203a, 203b are called nucleation surfaces ($S_{NDL}$) and the surface 202 non nucleation surface ($S_{NDS}$). If the nuclei generated on the nucleation surfaces 203a, 203b are further permitted to grow, they become the single crystals 204a, 204b (see FIGS. 1B, 1C), growing onto the non-nucleation surface 202 beyond the regions of the nucleation surfaces 203a, 203b, until contacting the single crystal 204b grown from the adjacent nucleation surface 203b to form a grain boundary 205. In the crystal formation method of the prior art, there have been reported an example, in which the nucleation surfaces 203a, 203b are formed of amorphous $Si_3N_4$, the non-nucleation surface 202 formed of $SiO_2$, and a plurality of Si single crystals according to the CVD method (see the above essay), and an example, in which the non-nucleation surface 202 is formed of $SiO_2$, the region which becomes the nucleation surface 203a is formed by injecting Si ions into the non-nucleation surface 202 with a focused ion beam, and subsequently a plurality of Si single crystals are formed according to the CVD method (The 35th Associated Lectures Related to Applied Physics, 1988, 28p-M-9).

However, when these single crystals are formed in lattice points in a plurality of crystal grains according to the crystal formation method with controlled formation positions thereof, there may sometimes occur the problems as shown below and in that case, problems may sometimes occur in forming a semiconductor integrated circuit or other electronic or optical elements.

Figure 1B:
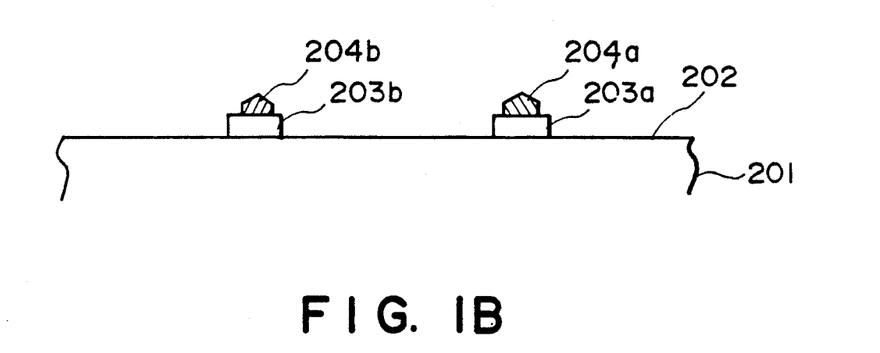
Figure 1C:
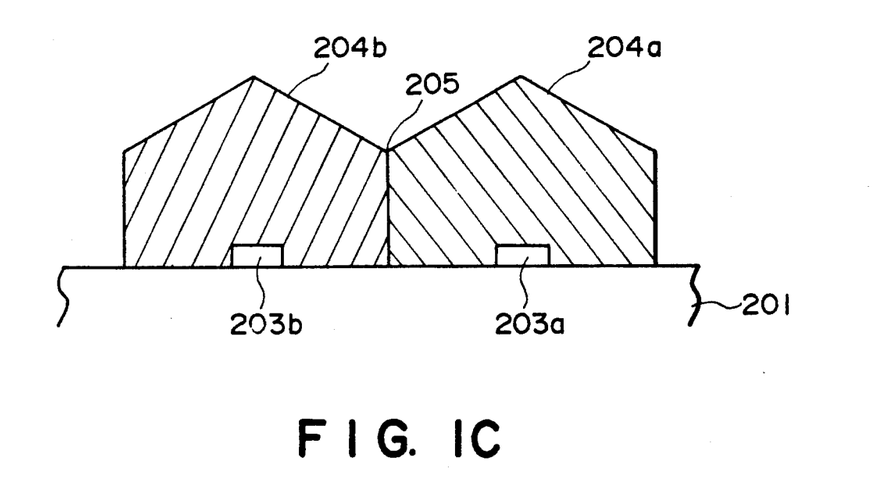
Figure 2A:
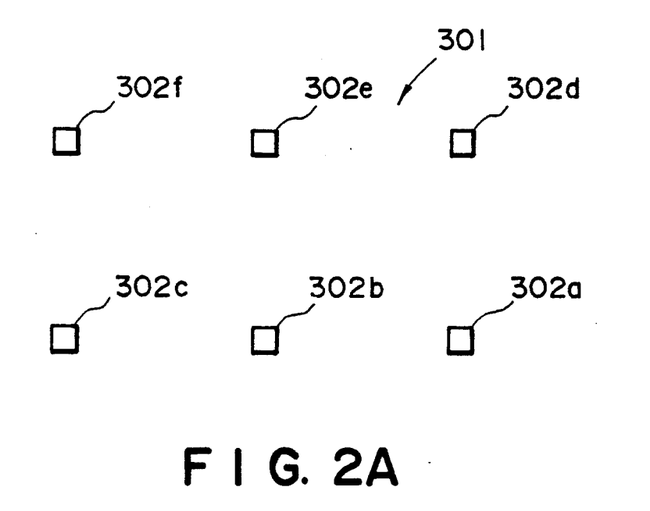
FIGS. 2A and 2B are schematic illustrations for explaining the steps of the method for forming crystal articles according to the prior art shown in FIGS. 1A to 1C as the top views.

More specifically, when the nucleation surfaces 203a, 203b shown in FIGS. 1A-1C are arranged in lattice points on the non-nucleation surface 301 as shown in FIG. 2A, and the crystal growth treatment is applied thereon, the single crystals grown from the nucleation surfaces which are the nearest nucleation surfaces to the nucleation surface 302b contact the single crystal 303a to form grain boundaries 304. However, at the central portion in the interval from the second nearest nucleation surface 303c relative to the nucleation surface 302b, the single crystals cannot completely contact each other whereby a void 305 may be sometimes generated [FIG. 2B]. This void 305 may be extinguished by close contact between the upper portions of the single crystals by elongating the crystal growth treatment time, but when the upper portions of the single crystals are removed to be flattened by etching or polishing so as to form a semiconductor integrated circuit, or other elements, etc., the void 305 may be sometimes observed to appear.

Figure 2B:
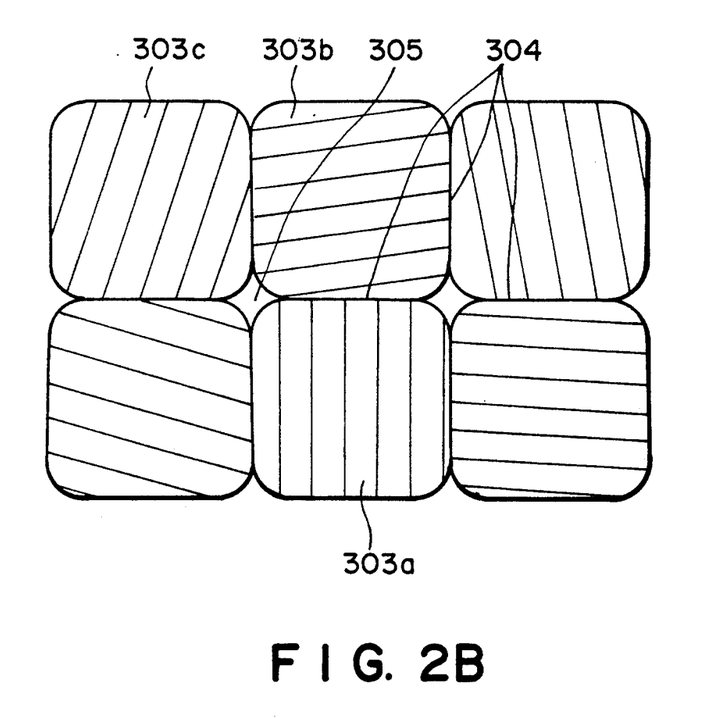

On the void 305, it is impossible to form an element utilizing the characteristics of the single crystal such as MOS transistors, diodes, etc. Further, even when a thin film intended to wiring is desired to be formed on the void 305, since the film thickness of the crystal grain after flattening is some 100 Å or higher, generally about 1 μm from the demand in formation of the element, and from the point of controllability of flattening, when the thickness of the single crystal 303a surpasses this thickness, there also sometimes occurred wire breaking at the stepped difference portion between the void 305 and the single crystal 303a. Accordingly, when the surface portions of a plurality of single crystals formed according to the crystal formation method in which these single crystals are formed with controlled positions thereof are flattened by cutting, and a semiconductor integrated circuit or other elements, etc. are formed thereon since the active region is formed by avoiding the void 305, the circuit constitution or the element constitution is restricted as it is lowered in degree of freedom in design, or troubles may sometimes occur in miniaturization of the element.

SUMMARY OF THE INVENTION

The present invention has been accomplished in view of the various points as mentioned above, and its object is to provide a crystal article having a plurality of single crystals formed on a substrate with controlled positions and sizes as desired, which can prepare easily a semiconductor integrated circuit device or other electronic, optical elements while ensuring degree of freedom in design, and also can effect miniaturization, higher integration as a whole, and a method for forming the same.

Another object of the present invention is to provide a crystal article which has solved the above problems of the prior art by previously arranged a void generation preventive body matching in size and shape to the void 305 at the position where the void 305 can be generated as such, and thereafter permitting the single crystals to grow from each crystal growth origination point by applying the crystal growth treatment to the substrate 301, thereby inhibiting generation of the void 305, and a method for forming the same.

Still another object of the present invention is to provide a crystal article, comprising a substrate and a plurality of single crystals provided on the substrate under the state mutually contacting each other, with the portion surrounded by the plurality of single crystals being filled with a void generation preventive body.

Yet another object of the present invention is to provide a method for forming a plurality of single crystals on a substrate having a plurality of crystal growth origination points provided thereon by applying a crystal growth treatment for an enough time for the adjacent points to contact each other, wherein, at the predetermined position of a void capable of being formed between the single crystals, a void generation preventive body for filling the void is previously provided.

DESCRIPTION OF THE PREFERRED EMBODIMENTS

In the method of forming a plurality of single crystals on a substrate by controlling their positions from the origination points of crystal growth and controlling the position of the grain boundaries formed at the portion where the single crystals contact each other and the size of the single crystals (the selective growth method), the positions and sizes of the voids are also consequently controlled. Accordingly, in the present invention, at the positions where voids are to be formed, prior to the crystal growth treatment, void generation preventive bodies are arranged, which are suited for the sizes and shapes of the voids.

Here, the origination points for crystal growth should have great nucleation density for the material of the crystal to be formed, and desirably be formed of a material with a nucleation density which is greater by at least $10^2$-fold than the nucleation density of the non-nucleation surface of the substrate surface, more preferably by at least $10^3$-fold.

The void generation preventive body should be preferably constituted of a material which has a nucleation density at its surface sufficiently small to the extent as the non-nucleation surface and can sufficiently inhibit nucleation at the surface thereof during crystal growth.

By applying the crystal formation treatment on the substrate applied with the treatment necessary for control of the position of the crystals and provided with the void generation preventive body, the single crystals grown with their formation positions controlled will contact the adjacent single crystals to form grain boundaries, and also due to the presence of the void generation preventive bodies at the portions where voids have been formed in the prior art, will contact the void generation preventive bodies at the void generation portions, whereby no void between single crystals as seen in the prior art is generated.

Further, according to the present invention, since a group of flat single crystals formed by single crystals through contact with grain boundaries are obtained, in addition to acceleration of the actuation by formation of active elements such as transistors, etc., it is also possible to effect further higher densitification of the element constitution by forming passive elements or wirings such as diodes, transistors, etc. at the portions crossing the grain boundaries.

Figure 3A:
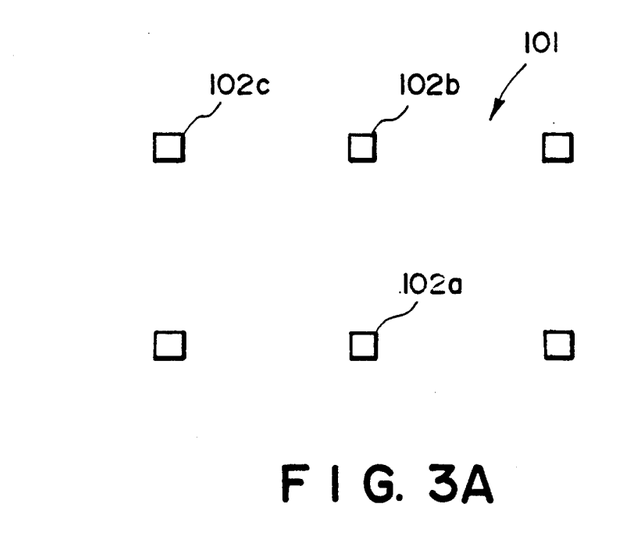
FIGS. 3A to 3C are schematic illustrations for explaining the steps of the method for forming a crystal article according to the present invention, respectively.
Figure 3B:
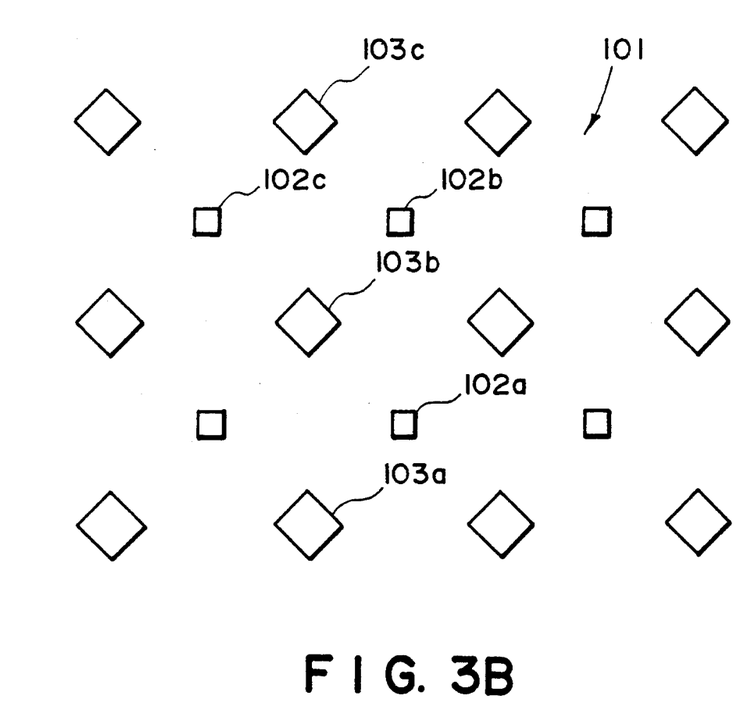
Figure 3C:
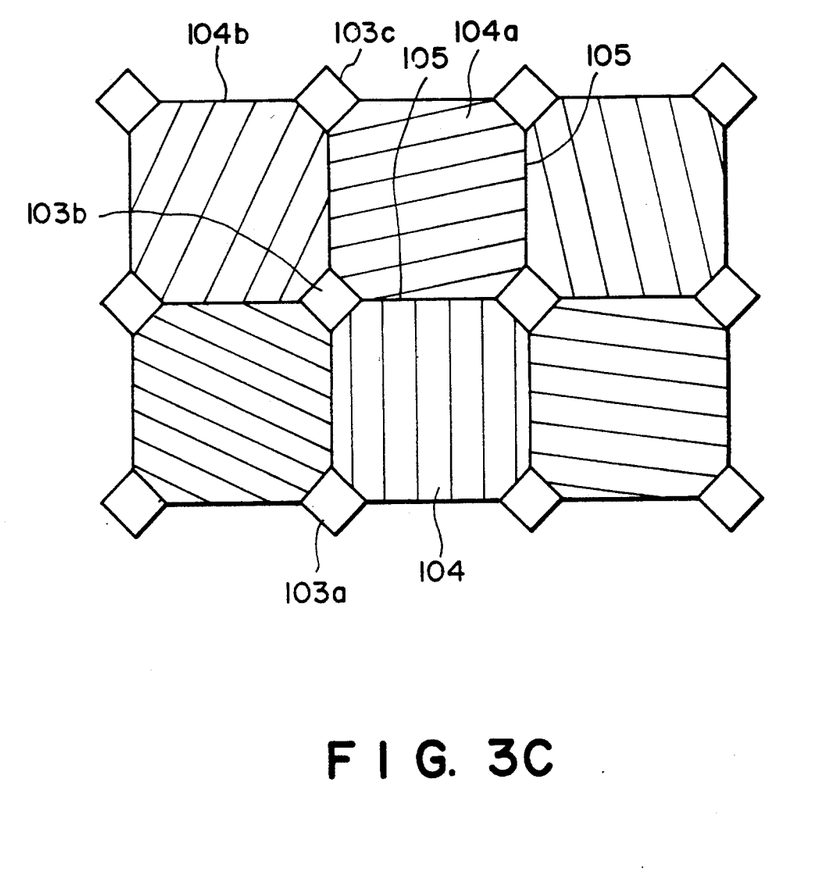

Referring now to FIGS. 3A–3C, the crystal article and the method for formation thereof according to the present invention are to be described.

On a base material 101, the treatment necessary for controlling the position for formation of the crystal is applied. That is, a substrate having origination points for crystal growth is formed. For example, there may be also employed the method in which a substrate having a plurality of fine single crystal grains 102a, 102b, 102c arranged at desired positions on the surface of the base material 101 to become the non-nucleation surface is used [see FIG. 3A].

Alternatively, for example, it is also possible to use a substrate having a non-nucleation surface and a plurality of nucleation surfaces provided at desired positions and having an area sufficiently small to result in the formation of only a single nucleus from which a single crystal is grown on the base material 101.

As the base material 101, any of materials suited for subsequent treatments such as Si wafer, quartz glass, ceramics, etc. may be available.

As the method of forming the substrate having the nucleation surface arranged thereon, a material with great nucleation density may be arranged with fine sizes, or fine openings may be provided in the layer of a material with small nucleation density covering over the material with great nucleation density to have the material with great density exposed, or alternatively it may be also formed by ion implanting those ions which elevate the nucleation density of the non-nucleation surface into the fine regions of the non-nucleation surface.

The surface area of the nucleation surface for forming a single crystal with good selectivity may be preferably 16 $\mu m^2$ or less, more preferably 4 $\mu m^2$ or less, optimally 1 $\mu m^2$ or less.

As preferable examples of the material of the non-nucleation surface, non-single crystalline inorganic materials such as quartz glass, thermally oxidized silicon, silicon nitride, alumina, etc. may be included.

As preferable examples of the material of the nucleation surface, materials such as amorphous silicon, silicon nitride, etc. may be included.

Also, when forming single crystal grains as the origination point for crystal growth by applying thermal treatment to a non-single crystalline material, a suitable impurity such as P, B, As, etc. may be also added for promoting single crystal formation from the non-single crystalline material. Its amount added mag be preferably $1 \times 10^{20}$ atoms/cm$^3$, more preferably $7.5 \times 10^{20}$ atoms/cm$^3$.

At the positions where voids are formed when crystal growth treatment is applied on the substrate having origination points for crystal growth, void generation preventive bodies 103a, 103b, 103c are arranged [FIG. 3B]. The void generation preventive bodies 103a, 103b, 103c are to be described in detail below.

Subsequently, when the crystal growth treatment is applied on the substrate 101 shown in FIG. 3B, a single crystal 104 grows to contact the adjacent single crystal grain 104a to form a grain boundary 105, and also contacts the void generation preventive bodies 103a, 103b [FIG. 3C]. Here, the single crystal 104 to be grown may be a crystal of Si, Ge, GaAs, InP, etc. or any other one. Also, the order of the step of providing the crystal growth origination point and the step of providing the void generation preventive body as described above may be reversed. That is, it is also possible to arrange previously the void generation preventive bodies on the substrate and then applying the treatment necessary for controlling the positions at which the crystals are formed.

Preferable examples of the treatment of the crystal growth treatment applicable in the present invention may include the gas phase method such as the normal pressure CVD, the reduced pressure CVD, the plasma CVD, the optical CVD, sputtering etc., and the liquid phase method such as the gradual cooling method, the temperature gradient method, etc.

Next, the void generation preventive body is to be described in detail.

The void generation preventive body is required to have a sufficiently low nucleation density to the same extent as the non-nucleation surface, when considering the nucleation density at its surface so that no nucleus may be formed on the void generation preventive body surface during the crystal formation treatment. Specifically, it is required to be $10^{-2}$-fold or less of the nucleation density of the nucleation surface, desirably substantially the same as the non-nucleation surface or less.

As the material constituting the void generation preventive body, those preferably used in the present invention in view of the above demand may include such substances as $SiO_x$, $SiN_x$, $SnO_x$, $InO_x$, etc.

The shape of the void generation preventive body may be in conformity with the shape of the void formed according to the prior art method. For example, when the nucleation surfaces which are origination points for crystal growth are arranged in lattice points, the voids are formed substantially in square shapes and therefore the void generation preventive bodies should preferably be formed in square shapes as the shape observed from above so as to match the shapes of the voids.

The shape of the void generation preventive body as observed from above should be preferably made a shape having a plane substantially vertical toward the adjacent origination point for crystal growth.

When an active element is formed by use of the crystal article as described above, the surface portion of the single crystal is flattened by etching polishing, etc., and a semiconductor circuit or various elements are formed at the flat portion formed. If the thickness of the single crystal after flattening is made t, according to the flattening treatment without selectivity, with the thickness of the void generation preventive body being as t or more, the surface portions of the single crystals and the void generation preventive body are cut at the same time to obtain the desired thickness t.

On the other hand, according to the flattening treatment which cuts selectively the surface portion of the single crystal relative to the void generation preventive body, the thickness of the void generation preventive body is made to be equal to or similar to t and used for the end point detection of the flattening treatment.

The method for forming the void generation preventive body as described above may be any method, but, for example, the following method may be employed. First, a thin film comprising the void generation preventive body is deposited according to conventional thin film deposition method (e.g. any of thermal CVD, APCVD, LPCVD, plasma CVD, optical CVD, sputtering, etc.), and then the desired portion may be left to remain as the void generation preventive body with removal of the other portions according to conventional photolithography.

In the following, Examples in which a plurality of Si single crystals are formed on a substrate according to the present invention are shown.

Example 1

First, with the use of a Si (100) wafer substrate as the base material, an amorphous silicon oxide film with a thickness of about 1000 Å was formed by the thermal oxidation method. Next, according to conventional reduced pressure CVD method by use of starting gases of $SiH_2Cl_2$ and $NH_3$, a silicon nitride film was deposited to 300 Å on the silicon oxide film. Next, according to conventional resist process, the silicon nitride film was arranged in square shapes with one side of 2 μm in lattices with intervals of 80 μm, and patterning treatment was effected at the other region so that the silicon oxide surface was exposed. This was then applied with the etching treatment according to the RIE method (reactive ion etching method) to remove unnecessary portions of the silicon nitride film.

Next, according to the normal pressure CVD method, a silicon oxide film was further deposited to 5000 Å on the substrate treated as described above. The silicon oxide film was subjected to the patterning treatment according to conventional resist process so that a square with one side of 10 μm was formed at the center portion of the square constituted of the silicon nitride films arranged in four lattice points so as to be slanted at 45° with respect to the square constituted of the silicon nitride films. This was applied with the etching treatment according to the RIE method to remove unnecessary portions of the silicon oxide film to provide void generation preventive bodies 103a, 103b, 103c, . . . (silicon oxide films) (see FIG. 3B).

On the substrate applied with such treatment, Si was deposited according to the CVD method as the crystal growth treatment. The deposition conditions were made as follows.

Gases used (flow rate ratio):-$SiH_2Cl_2/HCl/H_2 = 0.53/1.6/100.0$ (slm)

Substrate temperature and Pressure:1000° C., 150 Torr

Deposition time:90 min.

As the result, with the centers of all the nucleation surfaces arranged in lattice points as the crystal growth origination points, Si single crystals with a grain size of about 80 μm were grown, which contacted the single crystals grown from the adjacent nucleation surfaces at substantially the intermediate position between the adjacent nucleation surfaces to form a grain boundary. Further, the Si single crystals also contacted the silicon oxide films (void generation preventive bodies) 103a, 103b, 103c . . . , and the respective single crystals were found to be grown up to the position higher than the surface of the silicon oxide film (void generation preventive body) at many places. Further, when polishing was effected on the surface portions of the respective Si single crystals according to the selective polishing method as described in the Research Report SSD 86-63 of Japanese Society of Electrical Communication, polishing was completed with the silicon oxide films 103a, 103b, 103c . . . as the stopper. When the substrate thus treated was again subjected to surface observation by an optical microscope, a flat surface comprising a group of Si single crystals and a group of silicon oxide films was observed.

Example 2

First, with the use of a Si (100) wafer substrate as the base material, a silicon oxide film with a film thickness of about 1000 Å was formed according to the thermal oxidation method.

On the silicon oxide film was deposited an amorphous silicon (hereinafter abbreviated as a-Si) film according to the conventional reduced pressure CVD method by use of SiH$_4$ gas under the growth conditions of a substrate temperature of 560° C. and a pressure of 0.3 Torr to a thickness of 1000 Å. When the deposited film was examined by X-ray diffraction, it was confirmed to be completely amorphous. Then, phosphorus was doped into the a-Si film as the impurity at a concentration of $7.5 \times 10^{20}$ cm$^{-3}$ by thermal diffusion by use of POCl$_3$.

Next, according to conventional resist process, the a-Si film subjected to the doping was arranged with square shapes with one side of 2 μm in lattice points at intervals of 80 μm, and the other region was subjected to the patterning treatment so that the surface of the silicon oxide film was exposed. This was applied with the etching treatment by the RIE method (reaction ion etching) to remove unnecessary portion of the doped a-Si film, thereby forming the a Si (P) films 102a, 102b, 102c . . . which become the nucleation surfaces.

Further, the a-Si films formed finely were annealed. The annealing conditions at that time were made an annealing temperature of 950° C. and an annealing time of 20 minutes in N$_2$ atmosphere. The annealing temperature in this case may be sufficiently 800° C. or higher. After annealing, examination by the X-ray diffraction method revealed that all of the a-Si (P) films were formed into single crystals with the face orientation regularly in the <111> direction (single crystalline Si (P) film). This phenomenon is also known in Y. Wada and S. Nishimatsu, J. Electrochem. Soc. 125, 1499 (1978) and others, and called "Abnormal grain growth".

On the substrate having a large number of single crystalline Si (P) films formed on predetermined positions on the surface, a silicon oxide film was deposited to 5000 Å according to the conventional CVD method. The silicon oxide film was subjected to the patterning treatment according to the conventional resist process so that the squares with one side of 10 μm were arranged at the center portion of the square (one side:80 μm) with the positions of the single crystalline Si (P) films arranged in four lattice points as the apexes so as to be slanted at 45° relative to the square. This was applied with the etching treatment according to the RIE method to remove unnecessary portion of the silicon oxide film, thereby forming void generation preventive bodies (silicon oxide films) 103a, 103b, 103c . . .

On the substrate having thus void generation preventive bodies 103a, 103b, 103c . . . formed thereon, Si was deposited according to the CVD method. The deposition conditions were made as follows.

Gases used (flow rate ratio):- SiH$_2$Cl$_2$/HCl/H$_2$×0.53/1.7/100.0 (1/min)

Substrate temperature and Pressure:1000° C., 150 Torr

Deposition time:90 min.

As the result, with the centers of all the nucleation surfaces arranged in lattice points as the crystal growth origination points, Si single crystals with a grain size of about 80 μm were grown, which contacted the single crystals grown from the adjacent nucleation surfaces to form a grain boundary. Further, the Si single crystals also contacted the silicon oxide films and the Si single crystals were found to be grown up to the surface of the silicon oxide films at many places. As the result of observation by an optical microscope, all the surfaces were found to be covered with Si single crystals and the silicon oxide films. Further, when polishing was effected on the surface portions of the respective Si single crystals according to the selective polishing method similarly as in Example 1, polishing was completed with the silicon oxide films as the stopper. When the substrate thus treated was again subjected to surface observation by an optical microscope, a flat surface comprising a group of Si single crystals and a group of silicon oxide films was observed.

According to the present invention, by arranging previously void generation preventive bodies filling the portion of voids capable of being formed at the gaps between the single crystals formed according to the prior art method prior to the crystal growth treatment, generation of voids can be inhibited, which will cause problems such as step cutting of wiring, etc. in forming semiconductor integrated circuits in the single crystal group after the flattening treatment or other electrical, optical elements and become remarkable troubles with respect to its circuit constitution or yield. Also, according to the present invention, since there is no void which is readily formed as in the prior art method, the degree of freedom is higher in its design and constitution to effect further higher densification in forming semiconductor integrated circuits or other electronic, optical elements.

What is claimed is:

1. A crystal article comprising a substrate having a nucleation and a non-nucleation surface, a plurality of single crystal contacting each other and a void generation preventive body filling the portions surrounded by said plurality of single crystals, wherein the surface of said void generation preventive body is a non-nucleation surface having a nucleation density which is at most $10^{-2}$ times the nucleation density of the nucleation surface.

2. A crystal article according to claim 1, wherein said single crystal is formed by the selective growth method.

3. A crystal article according to claim 1, wherein said void generation preventive body is an insulating material.

4. A crystal article according to claim 1 wherein said void generation preventive body comprises an insulative material selected from the group consisting of silicon oxide, silicon nitride, tin oxide and indium oxide.

5. A crystal article according to claim 1, wherein said void generation preventive body is silicon oxide.

6. A crystal article according to claim 1, wherein the shape of said void generation preventive body is substantially square as observed from above.

7. A crystal article according to claim 1, wherein said void generation preventive body is formed by the CVD method.

8. A crystal article according to claim 1, wherein said void generation preventive body has a surface substantially vertical toward the growth origination point of the adjacent single crystals as observed from above.

* * * * *

UNITED STATES PATENT AND TRADEMARK OFFICE
CERTIFICATE OF CORRECTION

PATENT NO. : 5,320,907
DATED : June 14, 1994
INVENTOR(S) : Nobuhiko Sato

It is certified that error appears in the above-indentified patent and that said Letters Patent is hereby corrected as shown below:

COLUMN 1

Line 5, "continuation-in-part" should be deleted.
Line 18, "controlled" should read --controlled,--.
Line 40, "substrate" should read --substrate,--.
Line 45, "non nucleation" should read --non-nucleation--.

COLUMN 2

Line 2, "below" should read --below,--.
Line 16, "other" should read --other,--.
Line 19, "elongating" should read --lengthening--.
Line 28, "to wiring" should read --for wiring--.
Line 34, "occurred" should read --occurs--.
Line 41, "thereon" should read --thereon,--.
Line 61, "arranged" should read --arranging--.

COLUMN 3

Line 11, "an enough" should read --enough--.

COLUMN 4

Line 4, "densitification" should read --densification--.
Line 56, "mag" should read --may--.

COLUMN 5

Line 49, "etching" should read --etching,--.

UNITED STATES PATENT AND TRADEMARK OFFICE
CERTIFICATE OF CORRECTION

PATENT NO. : 5,320,907
DATED : June 14, 1994
INVENTOR(S) : Nobuhiko Sato

It is certified that error appears in the above-indentified patent and that said Letters Patent is hereby corrected as shown below:

COLUMN 6

Line 17, "$SiH_2Cl_2$" should read --$SiH_2Cl_2$--.
Line 47, "1000°C.," should read --1000°C.,--.

COLUMN 7

Line 16, "1000 Å." should read --1000 Å.--.
Line 51, "10 μm" should read --10 μm--.
Line 65, "$H_2$x0.53" should read --$H_2$=0.53--.
Line 68, "90 min." should read --90 min.--.

COLUMN 8

Line 29, "become" should read --cause--.
Line 30, "yield. Also" should read --yield. ¶ Also--.
Line 40, "crystal contacting" should read --crystals provided on said substrate with adjacent single crystals contacting--.
Line 52, "claim 1" should read --claim 1,--.

Signed and Sealed this

Thirteenth Day of December, 1994

Attest:

BRUCE LEHMAN

Attesting Officer       Commissioner of Patents and Trademarks